US011668826B2

(12) United States Patent
Hata et al.

(10) Patent No.: US 11,668,826 B2
(45) Date of Patent: Jun. 6, 2023

(54) PHOTODETECTOR

(71) Applicant: DENSO CORPORATION, Kariya (JP)

(72) Inventors: Takehiro Hata, Kariya (JP); Noriyuki Ozaki, Kariya (JP); Teiyu Kimura, Kariya (JP); Kenta Azuma, Kariya (JP); Shinji Kashiwada, Kariya (JP)

(73) Assignee: DENSO CORPORATION, Kariya (JP)

( * ) Notice: Subject to any disclaimer, the term of this patent is extended or adjusted under 35 U.S.C. 154(b) by 821 days.

(21) Appl. No.: 16/584,033

(22) Filed: Sep. 26, 2019

(65) Prior Publication Data
US 2020/0018853 A1 Jan. 16, 2020

Related U.S. Application Data

(63) Continuation of application No. PCT/JP2018/011754, filed on Mar. 23, 2018.

(30) Foreign Application Priority Data

Mar. 29, 2017 (JP) .............................. JP2017-065325
Jan. 26, 2018 (JP) .............................. JP2018-011556

(51) Int. Cl.
*G01S 17/10* (2020.01)
*H01L 31/0232* (2014.01)
*G01C 3/08* (2006.01)
*G01S 7/481* (2006.01)

(52) U.S. Cl.
CPC ................ *G01S 17/10* (2013.01); *G01C 3/08* (2013.01); *G01S 7/4816* (2013.01); *H01L 31/02327* (2013.01)

(58) Field of Classification Search
CPC ...... G01S 17/10; G01S 7/4816; G01S 7/4873; G01S 7/4863; G01C 3/08; H01L 31/02327
See application file for complete search history.

(56) References Cited

U.S. PATENT DOCUMENTS 10,732,281 B2 * 8/2020 LaChapelle ............. G01S 7/497
10,962,628 B1 * 3/2021 Laifenfeld .............. G01S 7/487

FOREIGN PATENT DOCUMENTS

JP 2014-081254 A 5/2014

* cited by examiner

*Primary Examiner* — David P Porta
*Assistant Examiner* — Mamadou Faye
(74) *Attorney, Agent, or Firm* — Maschoff Brennan

(57) ABSTRACT

A light reception array unit receives light irradiated from an irradiation unit and reflected from an object, and outputs in parallel a pulse signal respectively output from a plurality of light reception units. A timer unit measures an elapsed time since an input of an irradiation timing signal. A response acquisition unit acquires a number of responses, which is a number of the light reception units outputting the pulse signal, at each fixed cycle timing, and outputs an adjusted number of responses obtained by subtracting a bias value from the number of responses or dividing the number of responses by the bias value. An address of a memory is associated with a timer value measured by the timer unit. A histogram generation unit integrates and stores, in a memory address specified from a timer value, the adjusted number of responses as data at that address.

31 Claims, 6 Drawing Sheets

PHOTODETECTOR

CROSS-REFERENCE TO RELATED APPLICATION

The present application is a continuation application of International Application No. PCT/JP2018/011754, filed Mar. 23, 2018, which claims priority to Japanese Patent Application No. 2017-065325, filed Mar. 29, 2017 and Japanese Patent Application No. 2018-011556, filed Jan. 26, 2018. The contents of these applications are incorporated herein by reference in their entirety.

BACKGROUND

1. Technical Field

The present disclosure relates to a technique for detecting incoming light.

2. Related Art

There is known a photodetector that detects, with the use of a SPAD array in which a plurality of SPADs are arrayed, received light intensity by counting a number of pulse signals (hereinafter referred to as a number of responses) output from individual SPADs on which photons are incident. The SPAD is an abbreviation of Single Photon Avalanche Diode. The SPAD is an avalanche photodiode that operates in a Geiger mode and can detect an incidence of a single photon.

SUMMARY

The present disclosure provides a photodetector. One mode of the present disclosure is a photodetector provided with a light reception array unit, a timer unit, a response acquisition unit, a memory, and a histogram generation unit.

The light reception array unit receives light irradiated from an irradiation unit and reflected from an object, and outputs in parallel a pulse signal respectively output from a plurality of light reception units. The timer unit measures an elapsed time since an input of an irradiation timing signal indicating a timing at which the irradiation unit irradiates light. The response acquisition unit acquires a number of responses, which is a number of the light reception units outputting the pulse signal among the plurality of the light reception units, at each fixed cycle timing, and outputs an adjusted number of responses obtained by subtracting a bias value from the number of responses or dividing the number of responses by the bias value. An address of the memory is associated with a timer value measured by the timer unit. The histogram generation unit integrates and stores, in a memory address specified from a timer value in the timer unit, the adjusted number of responses as data at that address.

BRIEF DESCRIPTION OF THE DRAWINGS

In the accompanying drawings.

DETAILED DESCRIPTION OF THE PREFERRED EMBODIMENTS

Figure 1:
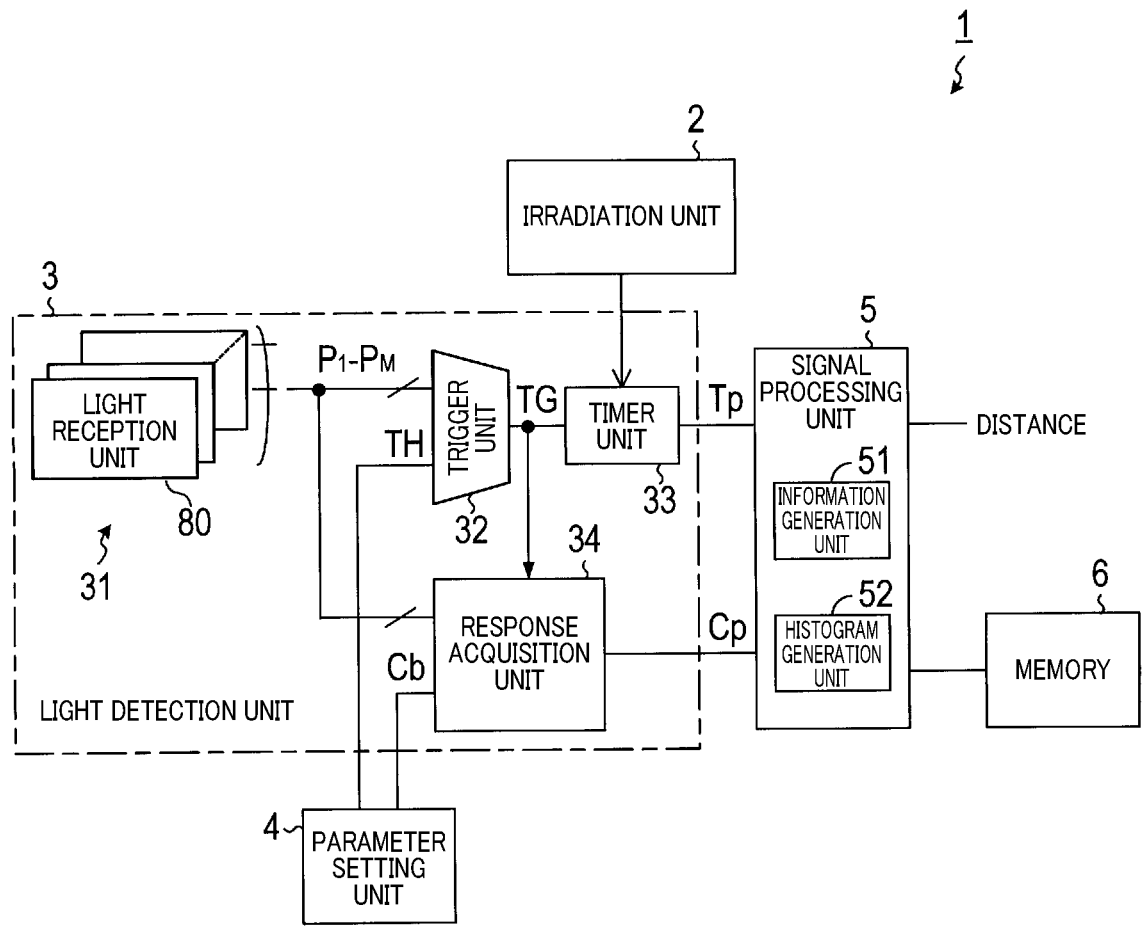
FIG. 1 is a block diagram showing a configuration of a laser radar according to a first embodiment.

JP 2014-081254 A (hereinafter, PTL1) discloses a technique wherein when reflected light is received when light is irradiated and then a number of responses detected by a photodetector is equal to or greater than a trigger threshold, a time of flight of the light from the irradiation to reception (hereinafter, TOF) is measured, and a distance to an object that has reflected light is obtained from the measured TOF thereof. The TOF is an abbreviation of Time Of Flight. In addition, in order to remove an influence of extraneous light or the like incident on the SPAD array, the measurement of the TOF is repeatedly performed to create a histogram in which the number of responses is integrated for each measurement time, and a time obtained from a maximal value of the histogram is used to calculate the distance.

However, the following problem was found in the related art described in PTL1 as a result of a detailed examination by the inventor. That is, when the extraneous light is strong, the number of responses detected in each measurement increases, and thus an integrated value in the histogram also increases. In order to prevent an overflow of this integrated value, it is necessary to prepare, as a memory storing the integrated value, a memory in which a bit width of the data area is sufficiently large, that is, a memory having a large storage capacity.

The present disclosure provides, in a laser radar using a histogram for calculating a TOF of light, a technique that can reduce a memory capacity required for storing a histogram, compared to the related art.

A photodetector according to one aspect of the present disclosure includes a light reception array unit, a timer unit, a response acquisition unit, a memory, and a histogram generation unit.

The light reception array unit has a plurality of light reception units that output a pulse signal in response to an incidence of a photon, irradiated from the irradiation unit, receive reflected light reflected from the object, and output in parallel a pulse signal output respectively from the plurality of light reception units. The timer unit measures an elapsed time since an input of an irradiation timing signal indicating a timing at which the irradiation unit irradiates light. The response acquisition unit acquires a number of responses, which is a number of the light reception units outputting the pulse signal among the plurality of the light reception units, at each fixed cycle timing, and outputs an adjusted number of responses obtained by subtracting a preliminarily set bias value from the number of responses or dividing the number of responses by the bias value. An address of the memory is associated with a timer value measured by the timer unit. The histogram generation unit integrates and stores, in a memory address specified from a timer value in the timer unit, the adjusted number of responses as data at the address.

According to such a configuration, when generating a histogram by integrating the adjusted number of responses, in order to integrate the adjusted number of responses that is smaller than the number of responses, a memory capacity can be reduced compared to a case where the number of responses is integrated as it is.

In addition, the reference numerals in parentheses described in the claims indicate a correspondence with a specific means described in the embodiments that will be described later as one embodiment and do not limit the technical scope of the present disclosure.

Hereinafter, embodiments of the present disclosure will be described with reference to the drawings.

1. First Embodiment

1-1. Configuration

A laser radar 1 of this embodiment is mounted on a vehicle, detects various objects present around the vehicle, and generates information about the objects. As shown in FIG. 1, the laser radar 1 includes an irradiation unit 2, a light detection unit 3, a parameter setting unit 4, a signal processing unit 5, and a memory 6. In addition, the light detection unit 3, the signal processing unit 5, and the memory 6 correspond to a photodetector. The photodetector may include at least one of the irradiation unit 2 and the parameter setting unit 4.

The irradiation unit 2 repeatedly irradiates pulsed laser light at preset intervals, and supplies an irradiation timing signal indicating an irradiation timing thereof to the light detection unit 3. Hereinafter, a cycle for irradiating the laser light is referred to as a measurement cycle.

The light detection unit 3 receives reflected light of a laser light irradiated from the irradiation unit 2 and generates time information Tp indicating a TOF which is a time of flight of light required from the irradiation to the reception and light quantity information Cp indicating a light quantity at a time of the light reception. TOF is an abbreviation of Time Of Flight.

The light detection unit 3 includes a light reception array unit 31, a trigger unit 32, a timer unit 33, and a response acquisition unit 34.

The light reception array unit 31 includes M light reception units 80. The M is an integer of 2 or more. Each of the light reception units 80 includes a SPAD. SPAD is an abbreviation of Single Photon Avalanche Diode. The SPAD is an avalanche photodiode operating in a Geiger mode which applies a voltage higher than a breakdown voltage as a reverse bias voltage, and is a detection element capable of detecting an incidence of a single photon. The total M SPADs each of which is included in one of the M light reception units 80 are two-dimensionally arrayed to form a light receiving surface.

Figure 8:
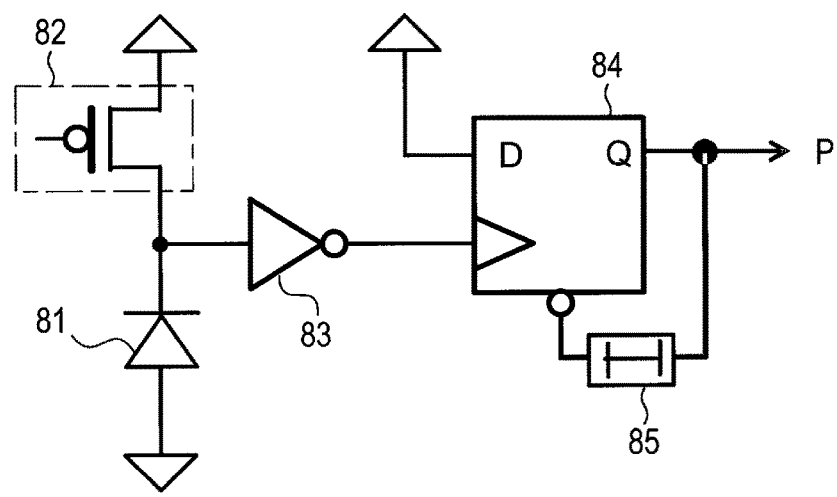
FIG. 8 is a circuit diagram showing a configuration of light reception units in the first to third embodiments.

As shown in FIG. 8, each of the light reception units 80 includes an SPAD 81, a quench resistor 82, an inverting circuit 83, a D flip-flop circuit (hereinafter, DFF circuit) 84, and a delay circuit 85. The SPAD 81 has its anode connected to a negative power supply and its cathode connected to a positive power supply via the quench resistor 82. The quench resistor 82 applies a reverse bias voltage to the SPAD 81. In addition, the quench resistor 82 stops a Geiger discharge of the SPAD 81 using a voltage drop generated by a current flowing through the SPAD 81 when a photon enters the SPAD 81 and the SPAD 81 undergoes breakdown. In addition, as the quench resistor 82, a resistive element having a predetermined resistance value or a MOSFET, the on-resistance of which can be set by a gate voltage, or the like is used.

The inverting circuit 83 is connected to the cathode of the SPAD 81. In a state where the SPAD 81 does not undergo breakdown, an input of the inverting circuit 83 is at a high level. In a state where the SPAD 81 undergoes breakdown, the current flows to the quench resistor 82, whereby the input of the inverting circuit 83 changes to a low level. In the DFF circuit 84, an output changes to a high level at a rising edge where an output of the inverting circuit 83 changes from a low level to a high level. The output of the DFF circuit 84 is connected to a reset terminal of a latch circuit 84 via the delay circuit 85. The delay circuit 85 inverts a signal level of the output of the DFF circuit 84 and delays the output by a preset delay time $\tau$ and supplies same to the reset terminal. As a result, when the delay time $\tau$ elapses after the output of the DFF circuit 84 changes to the high level, the DFF circuit 84 is reset and thus the output changes to the low level.

That is, when a photon is incident on the SPAD 81, in response to this, the light reception units 80 output a pulse signal P having a pulse width $\tau$. In addition, the pulse width $\tau$ is set to such a length that photons can be individually detected when the photons are continuously input to a same SPAD 81. In the following, each pulse signal output by the M light reception units 80 is represented by $P_1$ to $P_M$. In addition, outputs of the pulse signals $P_1$ to $P_M$ are performed in parallel.

The trigger unit 32 outputs a trigger signal TG indicating a light reception timing at a timing when a number of pulse signals $P_1$ to $P_M$ simultaneously output from the light reception array unit 31, that is, a number of responses, which is a number of the light reception units 80 outputting pulse signals in response to photons, exceeds a trigger threshold TH set in a threshold setting unit 4.

The timer unit 33 is a so-called TDC, and measures a time from when the irradiation timing signal is supplied from the irradiation unit 2 to the light reception timing indicated by the trigger signal TG, and outputs same as the time information Tp. TDC is an abbreviation of Time to Digital Converter.

The response acquisition unit 34 acquires a number of responses Cx, which is the number of pulse signals $P_1$ to $P_M$ simultaneously output from the light reception array unit 31, at a timing according to the trigger signal TG, and outputs, as the light quantity information Cp indicating a luminance of the received light signal, an adjusted number of responses, which is a result obtained by subtracting a bias value Cb from the number of responses Cx. That is, the light quantity information (that is, the adjusted number of responses) Cp is expressed by a formula (1).

$$Cp = Cx - Cb \qquad (1)$$

The timing according to the trigger signal TG may be a timing at which the trigger signal TG is output, or may be a timing after delaying this by a predetermined delay amount. The bias value Cb is a value set by the parameter setting unit 4. The parameter setting unit 4 includes a mechanical switch capable of setting the trigger threshold TH and the bias value Cb or a register capable of electrically writing the trigger threshold TH and the bias value Cb. Here, only the trigger threshold TH is arbitrarily set. That is, the trigger threshold TH corresponds to a target value. Then, the bias value Cb is set to a value obtained by subtracting 1 from the set trigger threshold TH. That is, the bias value Cb is expressed by a formula (2). Substituting the formula (2) into the formula (1) yields a formula (3).

$$Cb=TH-1 \qquad (2)$$

$$Cp=Cx-TH+1 \qquad (3)$$

The trigger threshold TH may be a value larger than 0, and may or may not be an integer. In addition, the parameter setting unit 4 may be configured in such a manner that only the bias value Cb is arbitrarily set and the trigger threshold TH is calculated from the set bias value Cb. In this case, the bias value Cb corresponds to the target value. Further, the trigger threshold TH and the bias value Cb do not necessarily have to be set in conjunction to fulfill a relation shown in the formula (2). In this case, both the trigger threshold TH and the bias value Cb correspond to the target value.

Figure 2:
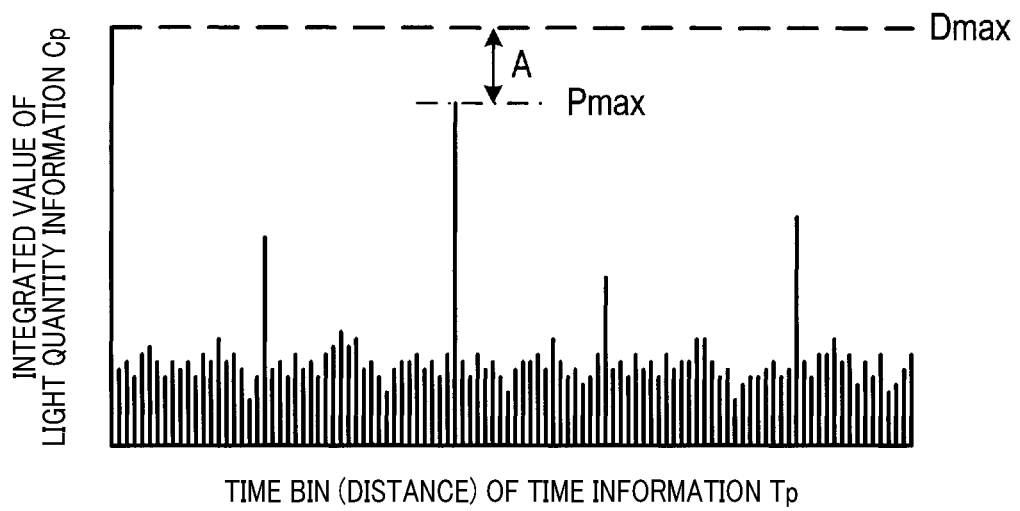
FIG. 2 is a graph illustrating a histogram in which a number of responses is integrated in association with a measured time.

An arbitrary readable and writable RAM is used for the memory 6. An address of the memory 6 is associated with a time bin of the timer unit 33, as shown in FIG. 2. The time bin refers to an individual time domain divided by a time resolution of the timer unit 33. A bit width of data stored in the memory 6 is set appropriately in accordance with at least one of an expected value of the number of responses detected in one measurement and a number of integrations X, which is a number of times the signal processing unit 5 repeats the integration when generating a histogram. The number of integrations X may be 1 or more.

The signal processing unit 5 includes an information generation unit 51 and a histogram generation unit 52. The histogram generation unit 52 operates for each measurement cycle, and updates content of a histogram stored in the memory 6 in accordance with the time information Tp and the light quantity information Cp output from the light detection unit 3. Specifically, data is read from an address of the memory 6 associated with the time information Tp, and a result of adding the light quantity information Cp to the read data is written to the same address. As a result, an integrated value of the light quantity information Cp is updated for a time bin indicated by the time information Tp.

The information generation unit 51 operates for every X measurement cycle, that is, each time a histogram is generated, and generates, information on an object that has reflected light, on the basis of the histogram generated by the histogram generation unit 52. Specifically, a maximal value of the histogram is extracted as a luminance, and for each of the extracted maximal values, a time bin corresponding to an address at which the maximal value is obtained is specified. Furthermore, object information including a distance to each object causing generation of the maximal value on the histogram and reliability of the object, and the like is generated on the basis of a combination of the extracted luminance and time bin (i.e., TOF). The generated object information is provided to various in-vehicle devices using the object information via an in-vehicle LAN (not shown).

1-2. Operation

Figure 3:
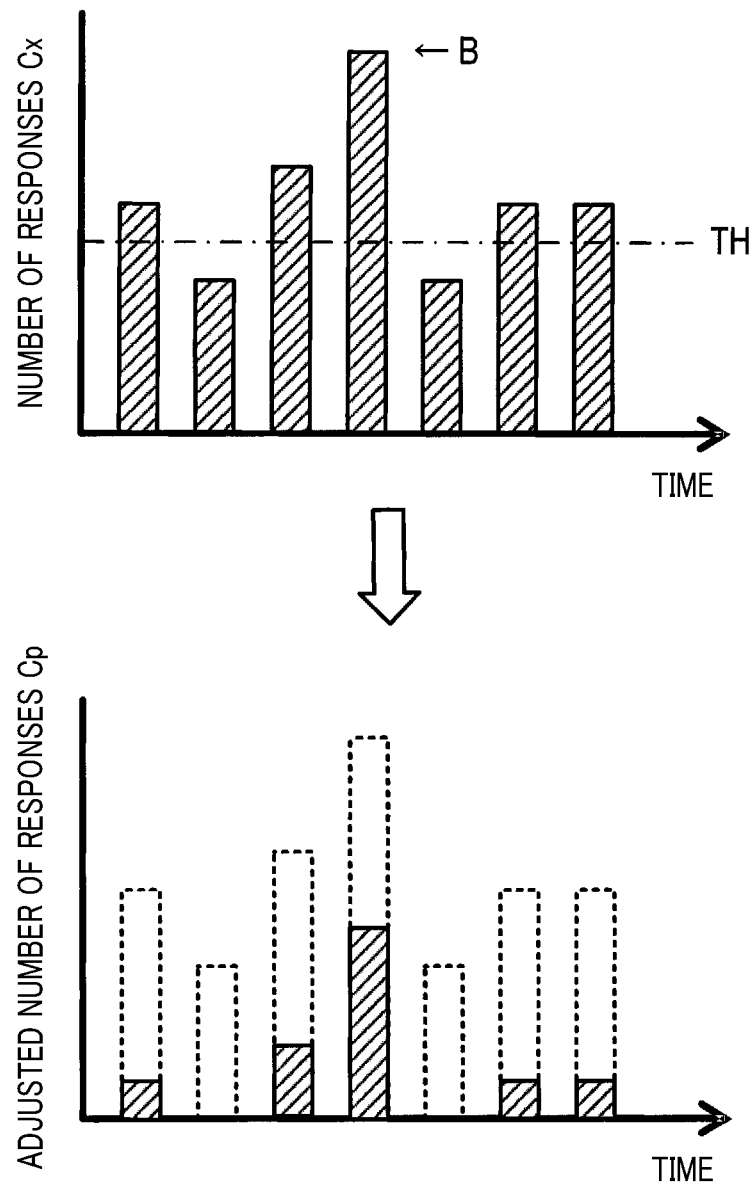
FIG. 3 is an explanatory diagram regarding an operation of a response acquisition unit.

As shown in FIG. 3, the response acquisition unit 34 uses, as the light quantity information Cp to be output to the signal processing unit 5, the adjusted number of responses obtained by subtracting the bias value Cb, instead of using the number of responses Cx as is. Therefore, when generating a histogram, a size of the light quantity information Cp integrated in each measurement cycle is reduced, and thus a final integrated value of the light quantity information Cp is reduced.

1-3. Effects

According to the first embodiment detailed above, the following effects are exhibited.

(1 a) According to the laser radar 1, the final integrated value of the light quantity information Cp in a histogram is reduced, and therefore, if the number of integrations X is the same, the capacity of the memory 6 storing the histogram can be reduced as compared to the related art. In addition, if the capacity of the memory 6 is the same, the number of integrations X can be increased and a detection accuracy can be improved as compared to the related art.

(1b) According to the laser radar 1, since the trigger threshold value TH and the bias value Cb can be arbitrarily set by the parameter setting unit 4, the abovementioned integrated value can be reduced more effectively by changing the set values appropriately depending on the environment used.

2. Second Embodiment 2-1. Difference from the First Embodiment

A basic configuration of a second embodiment is the same as that of the first embodiment, and thus a difference will be described below. In addition, same reference numerals as those in the first embodiment denote same components, and reference is made to a preceding description. In the first embodiment described above, the trigger threshold TH and the bias value Cb are manually set by the parameter setting unit 4a. On the other hand, the second embodiment is different from the first embodiment in that they are automatically variably set.

Figure 4:
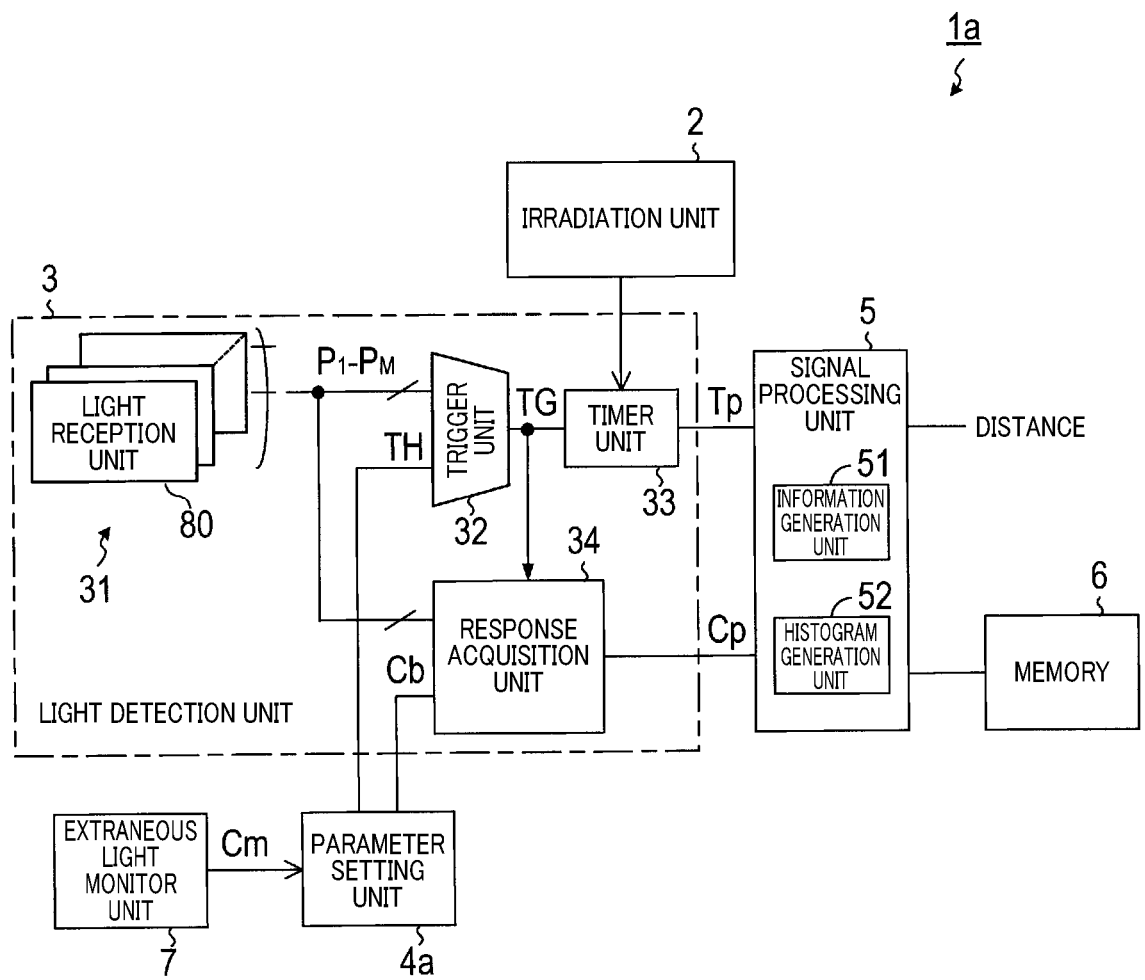
FIG. 4 is a block diagram showing a configuration of a laser radar of a second embodiment.

In the laser radar 1a of this embodiment, as shown in FIG. 4, an extraneous light monitor unit 7 is added to the laser radar 1 of the first embodiment, and the parameter setting unit 4a sets the trigger threshold TH in accordance with extraneous light information Cm which is a result detected by the extraneous light monitoring unit 7, and further sets the bias value Cb in accordance with the abovementioned formula (1).

Figure 5:
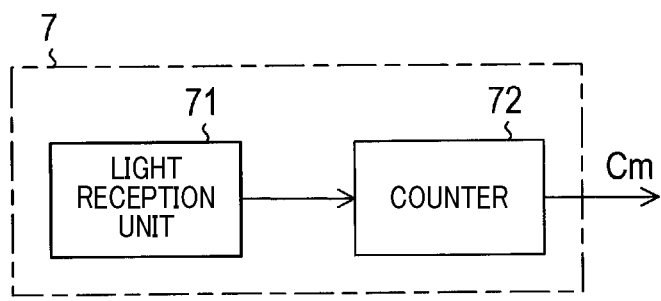
FIG. 5 is a block diagram showing a configuration of an extraneous light monitor unit.

The extraneous light monitor unit 7 includes light reception units 71 and a counter 72 as shown in FIG. 5. The light reception units 71 have the same configuration as that of the light reception units 80 that constitute the light reception array unit 31. However, the SPADs of the light reception units 71 are disposed adjacent to the light receiving surface formed by the M SPADs 81 included in the light reception array unit 31.

The counter 72 counts pulse signals output from the light reception units 71 at a timing when the light detection unit 3 does not make a measurement, and generates and outputs the extraneous light information Cm in accordance with the counting result.

The parameter setting unit 4a variably sets the trigger threshold TH and the bias value Cb in accordance with the extraneous light information Cm obtained from the extraneous light monitor unit 7 before the irradiation unit 2 irradiates light for each measurement cycle. Specifically, the trigger threshold TH and the bias value Cb are set to larger values as an amount of extraneous light indicated by the extraneous light information Cm increases. The parameter setting unit 4a sets the trigger threshold TH and the bias value Cb on the basis of, for example, an average level of extraneous light or a size obtained by adding a predetermined margin to the average level. In addition, the extraneous light refers to light other than the reflected light that is irradiated from the irradiation unit 2 and reflected by an object to be incident on the light detection unit 3.

2-2. Operation

Figure 6:
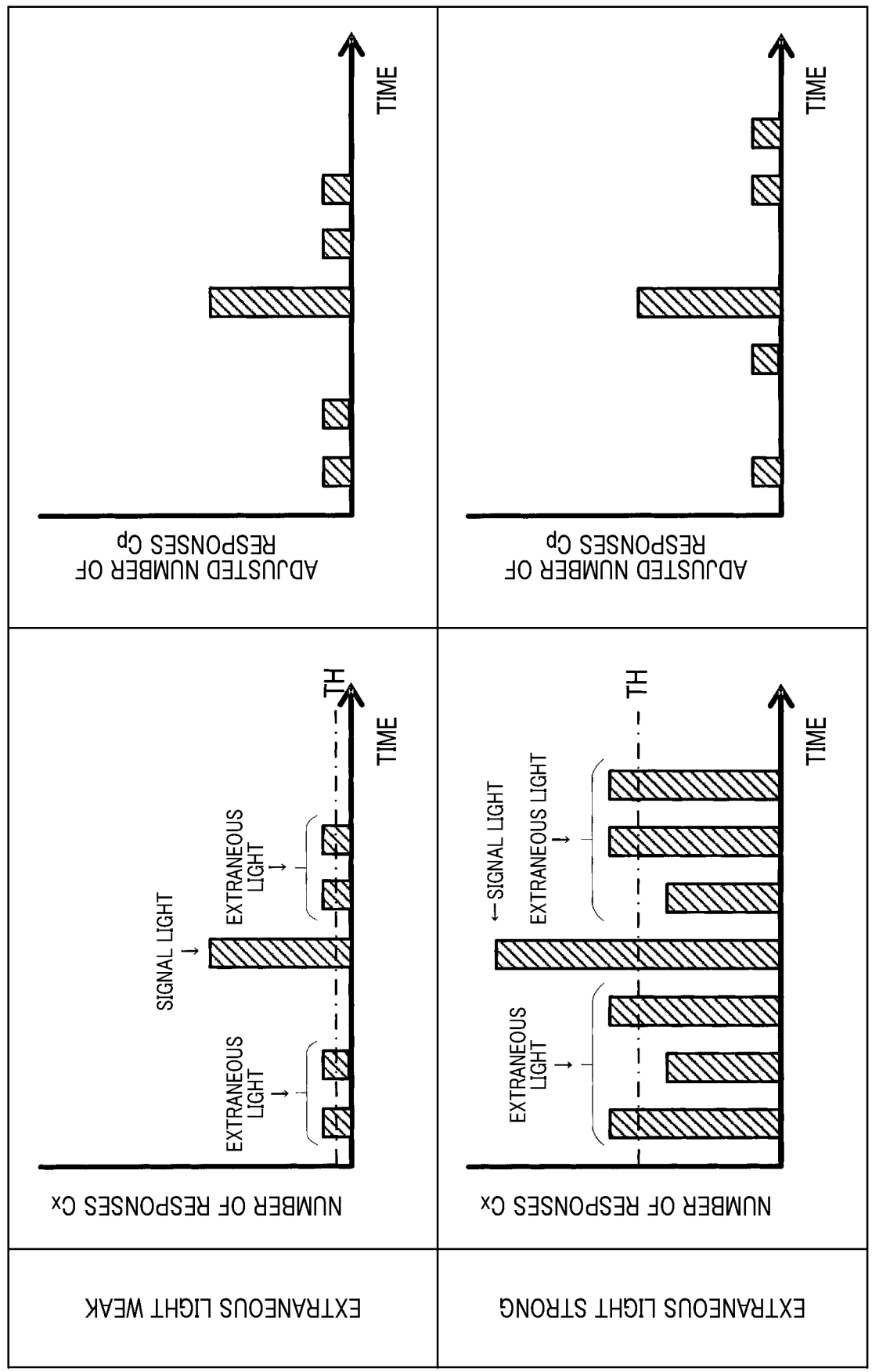
FIG. 6 is an explanatory diagram showing an effect produced by changing a trigger threshold in accordance with an intensity of extraneous light.

According to the laser radar 1a, when the extraneous light is weak, the trigger threshold TH is also set to a small value as shown in an upper part of FIG. 6, and when the extraneous light is strong, the trigger threshold TH is also set to a large value as shown in a lower part of FIG. 6. In any case, among the number of responses Cx, only a number exceeding the trigger threshold TH set to about the average level of the extraneous light, that is, a number obtained by subtracting the bias value Cb from the number of responses Cx, is output as the light quantity information Cp. In addition, while a case where the adjusted number of responses Cp which is a subtraction result is clamped at zero is illustrated in FIG. 3 and FIG. 6, the embodiment is not limited to this.

2-3. Effects

According to the second embodiment detailed above, the effect (1a) of the first embodiment described above is exhibited, and the following effects are further exhibited.

(2a) According to the laser radar 1a, even in a case where a situation of extraneous light changes, an overflow of a histogram can be reduced while maintaining a detection accuracy. That is, if the trigger threshold TH and the bias value Cb are fixed to large values in accordance with a situation in which the extraneous light is the strongest, a detection accuracy of light reflected from an object having a weak reflection intensity or a distant object is degraded. Meanwhile, if the trigger threshold value TH and the bias value Cb are fixed to small values in accordance with a situation where the extraneous light is weak, an integrated value of the histogram increases, and it is necessary to increase a required memory capacity or reduce a number of integrations. However, the laser radar 1a can suppress any of these problems.

(2b) According to the laser radar 1a, the trigger threshold TH is set in accordance with the extraneous light, and the light quantity information (that is, the adjusted number of responses) Cp is obtained with the use of the bias value Cb set in conjunction with the trigger threshold TH, and therefore the light quantity information Cp becomes such that a noise component due to the extraneous light is removed from the light quantity information Cp. In addition, according to the radar 1a, since a histogram is generated with the use of such light quantity information Cp, it is possible to extract signal light with an excellent signal-to-noise ratio.

3. Third Embodiment

3-1. Difference from the First Embodiment

A basic configuration of the third embodiment is the same as that of the first embodiment, and thus a difference will be described below. In addition, same reference numerals as those in the first embodiment denote same components, and reference is made to a preceding description.

In the first embodiment described above, the trigger threshold TH and the bias value Cb are manually set by the parameter setting unit 4. On the other hand, the third embodiment is different from the first embodiment in that the trigger threshold TH and the bias value Cb are automatically variably set. In addition, the third embodiment is different from the second embodiment in that settings of the trigger threshold TH and the bias value Cb are changed in accordance with an integration state of a luminance value in a histogram.

Figure 7:
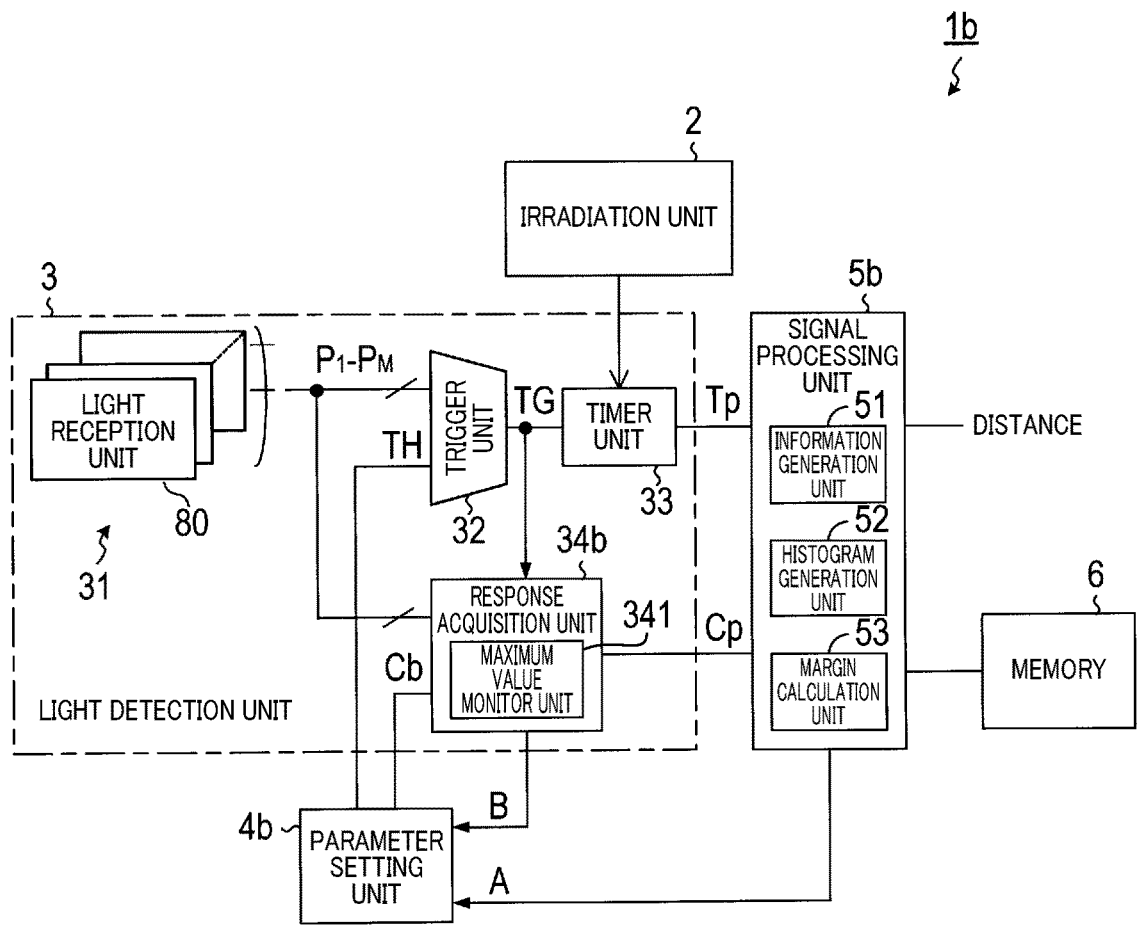
FIG. 7 is a block diagram showing a configuration of a laser radar of a third embodiment.

As shown in FIG. 7, the laser radar 1b of this embodiment differs from the laser radar 1 of the first embodiment in configurations of a response acquisition unit 34b, a parameter setting unit 4b, and a signal processing unit 5b. The response acquisition unit 34b includes a maximum value monitor unit 341 in addition to a configuration for implementing a function of the response acquisition unit 34. The maximum value monitor unit 341 monitors the number of responses Cx output from the light reception array unit 31 and extracts a maximum value thereof as a predicted number of responses B. The extraction of the predicted number of responses B may be performed by an instruction from an outside, may be performed periodically, or may be performed when a change in a surrounding environment is detected by some in-vehicle sensor.

The signal processing unit 5b includes a margin calculation unit 53 in addition to the information generation unit 51 and the histogram generation unit 52. Each time the histogram generation unit 52 updates the histogram, the margin calculation unit 53 obtains a margin value A indicating a margin of a memory. As shown in FIG. 2, among maximal values of the histogram, one having a largest value is extracted and is set as a Pmax. An integrated upper limit value, which is an upper limit value of storable data according to a bit width of a data area constituting a memory, is set as a Dmax. The margin value A may be obtained by a formula (3) or by a formula (4). Here, α represents a number of remaining integrations until a histogram generation is completed. The A in FIG. 2 indicates a margin value A obtained by the formula (3).

$$A = D\max - P\max \quad (3)$$

$$A = (D\max - P\max)/\alpha \quad (4)$$

The parameter setting unit 4b compares the trigger threshold TH set at that time with A−B in accordance with the predicted number of responses B and the margin value A, and adopts a larger one as the trigger threshold TH.

The parameter setting unit 4b may execute a variable setting of the trigger threshold TH using A and B only when the number of remaining integrations α becomes equal to or less than a predetermined value or when the margin value A becomes equal to or less than a predetermined value.

The trigger threshold TH to be compared with A−B may be a fixed value, or as shown in the second embodiment, may be a variable value set according to a situation. In addition, the parameter setting unit 4b may be configured to set the bias value Cb by the above method instead of the trigger threshold TH and to set the trigger threshold TH from the set bias value Cb with the use of the relation of the formula (1) or the like.

3-2. Effects

According to the second embodiment detailed above, the effect (1a) of the first embodiment described above is exhibited, and the following effects are further exhibited.

(3a) In the laser radar 1b, since the trigger threshold TH and thus the bias value Cb are set in accordance with the margin value A, an overflow of the integrated value of the light quantity information Cp in the histogram can be further reduced. In other words, by having this function, it is possible to further reduce a required memory capacity or improve detection accuracy by increasing the number of integrations X.

4. Fourth Embodiment

4-1. Difference from the First Embodiment

A basic configuration of the fourth embodiment is the same as that of the first embodiment, and thus a difference will be described below. In addition, same reference numerals as those in the first embodiment denote same components, and reference is made to a preceding description.

In the first embodiment described above, the trigger signal TG is generated, and the histogram is updated with the use of only the light quantity information Cp obtained at the timing of the trigger signal TG On the other hand, the fourth embodiment is different from the first embodiment in that the light quantity information Cp is repeatedly generated in synchronization with a clock and the histogram is updated with the use of all the light quantity information Cp.

Figure 9:
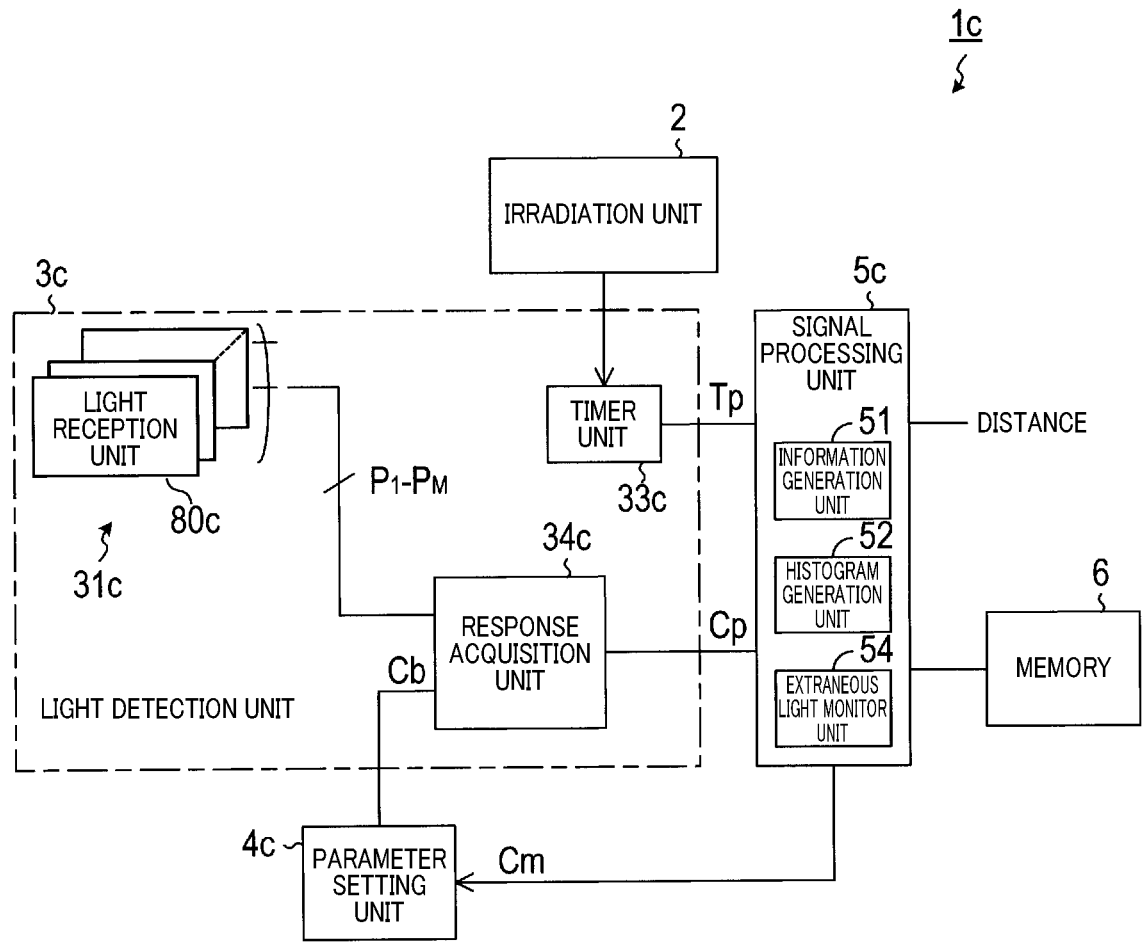
FIG. 9 is a block diagram showing a configuration of a laser radar of a fourth embodiment.

The laser radar 1c of this embodiment includes the irradiation unit 2, a light detection unit 3c, a parameter setting unit 4c, a signal processing unit 5c, and the memory 6, as shown in FIG. 9. The light detection unit 3c includes a light reception array unit 31c, a timer unit 33c, and a response acquisition unit 34c.

The light reception array unit 31c includes M light reception units 80c. A feature wherein each of the M light reception units 80c includes the SPAD and the M SPADs form a two-dimensionally arrayed light receiving surface is the same as in the first embodiment.

Figure 10:
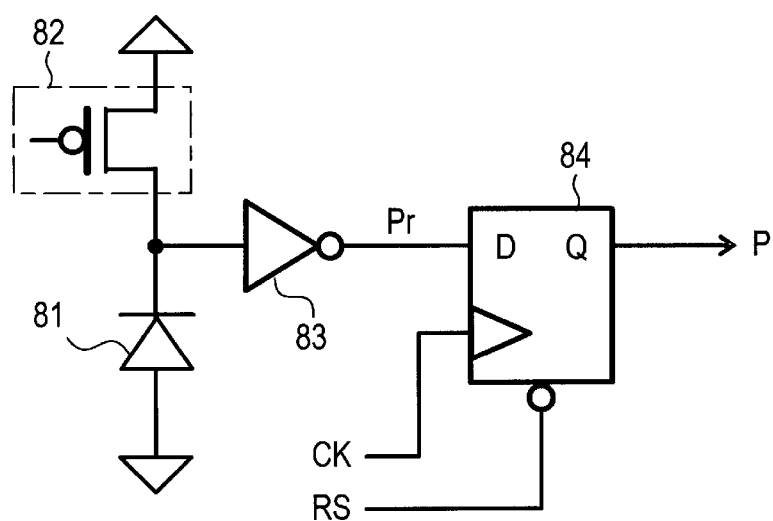
FIG. 10 is a circuit diagram showing a configuration of light reception units in a fourth embodiment.

As shown in FIG. 10, each of the light reception units 80c includes the SPAD 81, the quench resistor 82, the inverting circuit 83, and the DFF circuit 84. That is, compared with the light reception units 80 of the first embodiment, in the light reception units 80c, the delay circuit 85 is omitted, and a connection state of the DFF circuit 84 is different.

The DFF circuit 84 latches the output of the inverting circuit 83 at the timing of a rising edge of a clock CK, and outputs this as a pulse signal P. In addition, the output of the DFF circuit 84 is reset by a reset signal RS.

That is, when a photon is incident on the SPAD 81, the light reception units 80c output the pulse signal P in response to this. At this time, a pulse width of a pulse signal Pr output from the inverting circuit 83 continues until a Geiger discharge of the SPAD 81 stops due to a voltage drop generated by the current flowing through the quench resistor 82. This pulse signal Pr is converted by the DFF circuit 84 into a pulse signal P synchronized with the clock CK. That is, a pulse width of the pulse signal P output from the DFF circuit 84 includes a deviation by a quantization error due to the clock CK.

Referring back to FIG. 9, the timer unit 33c includes a synchronous counter that operates in accordance with the clock CK. The timer unit 33c starts counting with the irradiation timing signal supplied from the irradiation unit 2 and continues the counting operation for at least a time required for the light signal to reciprocate a maximum detection distance, and outputs a count value as the time information Tp. That is, the time information Tp changes in synchronization with the clock CK.

The response acquisition unit 34c constantly obtains the number of responses Cx, which is the number of pulse signals $P_1$ to $P_M$ simultaneously output from the light reception array unit 31c, with the use of an encoder or the like. Furthermore, the response acquisition unit 34c repeatedly calculates the adjusted number of responses, which is a result obtained by subtracting a bias value Cb from the number of responses Cx, at each timing of the clock CK, and outputs a calculation result as the light quantity information Cp indicating a luminance of the received light signal. That is, similarly to the time information Tp, the light quantity information Cp changes in synchronization with the clock CK.

The parameter setting unit 4c variably sets the bias value Cb in accordance with the extraneous light information Cm output from the signal processing unit 5c before the irradiation unit 2 irradiates light for each measurement cycle. Specifically, similarly to the parameter setting unit 4a of the second embodiment, the parameter setting unit 4c sets the bias value Cb to a larger value as the amount of extraneous light indicated by the extraneous light information Cm increases.

The signal processing unit 5c includes the information generation unit 51, the histogram generation unit 52, and an extraneous light monitor unit 54.

Although the histogram generation unit 52 operates in the same manner as in the first embodiment, since the time information Tp and the light quantity information Cp change in synchronization with the clock CK, a stored value at the address of the memory 6 is updated with the use of the light quantity information Cp.

While after the information generation unit 51 completes generation of information until the next measurement cycle starts, that is, during a period when the irradiation unit 2 does not perform light irradiation, the extraneous light monitor unit 54 causes the histogram generation unit 52 to generate a histogram in a state where the bias value is set to Cb=0. Furthermore, the extraneous light monitor unit 54 outputs the generated histogram per se or an average level of the extraneous light extracted from the histogram as the extraneous light information Cm.

4-2. Effects

According to the fourth embodiment detailed above, the effect (1a) of the first embodiment and the effect (2a) of the second embodiment are exhibited, and the following effects are further exhibited.

(4a) According to the laser racer 1c, since the time information Tp and the light quantity information Cp are constantly generated at a timing synchronized with the clock CK, there is no need to generate the trigger signal TG and the trigger unit 32 can be omitted, and thus a device configuration can be simplified.

(4b) According to the laser radar 1c, since the light reception array unit 31c used for measurement is utilized to generate the extraneous light information Cm, high functionality can be achieved without adding a new sensor to generate the extraneous light information Cm.

5. Other Embodiments

While the embodiments of the present disclosure have been described above, the present disclosure is not limited to the above-described embodiments, and various modifications can be made.

(5a) While the light quantity information (i.e., the adjusted number of responses) Cp is obtained by subtracting the bias value Cb from the number of responses Cx in the above embodiments, the present disclosure is not limited to this. For example, the light quantity information Cp may be obtained by dividing the number of responses Cx by the bias value Cb. In this case, the trigger threshold TH per se may be used as the bias value Cb. However, the trigger threshold TH needs to be set to a value larger than 1 in accordance with a relation $Cp<Cx/TH$.

(5b) While the trigger threshold TH and the bias value Cb are set manually, set on the basis of the extraneous light information Cm, the margin value A and the predicted response number B in the above embodiments, the present disclosure is limited is not limited to this. For example, at least one of date and time information indicating current date and time, position information indicating a current position, direction information indicating a current traveling direction, and weather information indicating a weather at the current position is acquired via a GPS device, a wireless communication device, or the like, and the trigger threshold TH and the bias value Cb may be set on the basis of a light quantity of the extraneous light estimated from these acquired information.

(5c) While the extraneous light monitor unit 7 that measures a physical quantity of light is used to generate the extraneous light information Cm in the second embodiment, the present disclosure is not limited to this. The extraneous light referred to here indicates a response other than a signal emitted by itself, and as to the extraneous light information Cm, it is sufficient to obtain a magnitude of the extraneous light. Therefore, as an alternative to or in addition to the extraneous light monitor unit 7, for example, a reflection characteristic monitor unit may be used. The reflection characteristic monitor unit detects at least one of the reflection characteristics of an object, specifically, a reflectance, a reflection intensity distribution, a wavelength characteristic, and a deflection characteristic, and generates the extraneous light information Cm from the detection result.

(5d) While the extraneous light monitor unit 7 is applied to the single light reception array unit 31 in the second embodiment, the present disclosure is not limited to this. For example, in a case where a light receiving surface is formed by a plurality of pixels and each pixel is formed by a plurality of SPADs, the light detection unit 3 (that is, the light reception array unit 31, the trigger unit 32, the timer unit 33, and the response acquisition unit 34) is provided in each pixel. Then, the extraneous light monitor unit 7 may be configured to measure extraneous light for each pixel, and a threshold setting unit 4a may be configured to change the trigger threshold TH for each pixel. The same applies to a case where a reflection characteristic monitor unit is used as an alternative to the extraneous light monitor unit 7.

(5e) While a maximum value of the observed number of responses Cx is used as the predicted number of responses B in the abovementioned third embodiment, the present disclosure is not limited to this. For example, the number M of light reception units 311 constituting the light detection unit 3 may be used as the predicted number of responses B. In addition, the trigger threshold TH and the predicted number of responses B may be set on the basis of a past histogram, or may be set on the basis of at least one of the trigger threshold TH, the bias value Cb, and the number of responses Cx. In this case, for example, the number of responses measured in a previous time may be used, or any one of an average number of responses in a most recent predetermined number, a maximum number of responses, and a number of most frequent responses may be used. Furthermore, the trigger threshold TH, the bias value Cb, and the predicted number of responses B may be set on the basis of data obtained by analyzing past data and removing abnormal values.

(5f) While the bias value Cb is set by the parameter setting unit in the abovementioned first to third embodiments, the bias value may be set by the response acquisition unit. In this case, the response acquisition unit may acquire the bias threshold TH and may calculate the bias value Cb on the basis of the acquired bias value TH.

(5g) While the fourth embodiment is different from the first to third embodiments in the configuration of the light detection unit, the extraneous light monitor unit 54 in the abovementioned fourth embodiment may be applied to the abovementioned first to third embodiments, and conversely, the extraneous light monitor unit 7 in the second embodiment and the maximum value monitor unit 341 and the margin calculation unit 53 in the third embodiment may be applied to the fourth embodiment.

(5h) A plurality of functions included in one component in the above embodiments may be implemented by a plurality of components, or one function included in one component may be implemented by a plurality of components. In addition, a plurality of functions included in a plurality of components may be implemented by one component, or one function implemented by a plurality of components may be implemented by one component. Further, a part of the configuration of the above embodiments may be omitted. Furthermore, at least a part of the configuration of the above embodiments may be added to or replaced with a configuration of other embodiments described above. In addition, all aspects included in the technical idea specified from the language described in the claims are embodiments of the present disclosure.

(5i) In addition to the above-described laser radar, the present disclosure can also be achieved in various forms, such as a system including the laser radar as a component and a method for integrating light quantity information.

What is claimed is:

1. A method for counting pulse signals using a light reception array unit and an irradiation unit, the light reception array unit including a plurality of light reception units outputting a pulse signal in response to an incidence of a photon, the light reception array unit being configured to receive light irradiated from an irradiation unit and reflected from an object and to output in parallel the pulse signal respectively output from the plurality of light reception units, the method comprising:
    measuring an elapsed time since an input of an irradiation timing signal indicating a timing at which the irradiation unit irradiates light;
    acquiring a number of responses, which is a number of the light reception units outputting the pulse signal among the plurality of the light reception units, at each fixed cycle timing, and outputting an adjusted number of responses obtained by subtracting a preliminarily set bias value from the number of the responses or dividing the number of responses by the preliminarily set bias value;
    associating an address of a memory with a timer value of a measured elapsed time; and
    integrating and storing, in the address specified from the timer value, the adjusted number of responses, as data at the address.

2. A method for counting pulse signals using a light reception array unit and an irradiation unit, the light reception array unit including a plurality of light reception units outputting a pulse signal in response to an incidence of a photon, and the light reception array unit being configured to receive light irradiated from an irradiation unit and reflected from an object and to output in parallel the pulse signal respectively output from the plurality of light reception units, the method comprising:
    comparing a number of responses, which is a number of the light reception units outputting the pulse signal among the plurality of the light reception units, with a trigger value, and outputting a trigger signal at a timing at which the number of responses reaches a trigger threshold;

measuring, at each timing according to the trigger signal, a time, from when an irradiation timing signal indicating a timing at which the irradiation unit irradiates light is input, to a timing at which a light signal indicated by the trigger signal is received;

acquiring the number of responses at each timing according to the trigger signal, and outputting an adjusted number of responses obtained by subtracting a preliminarily set bias value from the number of the responses or dividing the number of responses by the preliminarily set bias value;

associating an address of a memory with a timer value measured; and integrating and storing, in the address specified from the timer value, the adjusted number of responses, as data at the address.

3. The method according to claim 1, further comprising setting as a target value at least one of a trigger threshold and the bias value, and variably setting the target value.

4. The method according to claim 2, further comprising setting as a target value at least one of the trigger threshold and the bias value, and variably setting the target value.

5. The method according to claim 4,
wherein the trigger threshold is set as the target value,
and wherein the bias value is set as a value obtained by subtracting 1 from the trigger threshold, and the adjusted number of responses is obtained by subtraction.

6. The method according to claim 4,
wherein the bias value and the trigger threshold are interlocked and set in such a manner that the trigger threshold and the bias value are both set as the target value and the bias value becomes a value obtained by subtracting 1 from the trigger threshold,
and wherein the adjusted number of responses is obtained by subtraction.

7. The method according to claim 3, further comprising acquiring extraneous light information indicating a light quantity of extraneous light, and setting the target value to a larger value as the light quantity indicated by the extraneous light information becomes larger.

8. The method according to claim 7, further comprising measuring extraneous light incident on the light reception array unit,
wherein acquiring a measured value as the extraneous light information.

9. The method according to claim 8, further comprising integrating the adjusted number of responses without performing irradiation in a state where a bias value is set to zero, and setting a result of the integration as a measurement result of the extraneous light.

10. The method according to claim 8, further comprising:
receiving the reflected light using a plurality of pixels of the light reception array;
measuring the extraneous light for each of the plurality of pixels; and
changing the target value for each of the plurality of pixels.

11. The method according to claim 3, further comprising acquiring reflection characteristic information indicating a reflection amount of an object, and setting the target value to a larger value as the reflection amount indicated by the reflection characteristic information is larger.

12. The method according to claim 11, further comprising:
measuring a reflection characteristic of an object that is a source of reflected light incident on the light reception array unit; and
acquiring a measured value as the reflection characteristic information.

13. The method according to claim 12, further comprising:
receiving the reflected light using a plurality of pixels of the light reception array;
measuring the reflection characteristic for each of the plurality of pixels; and
changing the target value for each of the plurality of pixels.

14. The method according to claim 3, further comprising setting the target value with a use of date and time information, map information, and direction information.

15. The method according to claim 3, further comprising setting the target value with a use of a past value set.

16. The method according to claim 3, further comprising setting the target value with a use of an integration result of the adjusted number of responses generated in the past.

17. The method according to claim 3, further comprising setting the target value to a value obtained by subtracting a margin value that can be integrated in the memory from a predicted number of responses of the light reception array unit.

18. The method according to claim 17, further comprising setting, as the margin value, a difference between a maximum value of data storable in the memory and a maximal value in a histogram stored in the memory.

19. The method according to claim 17, further comprising setting, as the margin value, a value obtained by dividing, by a number of remaining integrations, a difference between a maximum value of data storable in the memory and a maximal value in an integration result of the adjusted number of responses stored in the memory.

20. The method according to claim 17, further comprising setting, as the predicted number of responses, a number of the light reception units included in the light reception array unit.

21. The method according to claim 17, further comprising:
observing a maximum number of responses that is a maximum value of the number of responses; and
setting the maximum number of responses as the predicted number of responses.

22. The method according to claim 1, further comprising obtaining a distance to an object that reflects light on a basis of an integration result of the adjusted number of responses generated.

23. The method according to claim 1, wherein the number of responses is a number of the light reception units simultaneously outputting the pulse signal.

24. The method according to claim 6, further comprising acquiring extraneous light information indicating a light quantity of extraneous light, and setting the target value to a larger value as the light quantity indicated by the extraneous light information is larger.

25. The method according to claim 4, further comprising acquiring reflection characteristic information indicating a reflection amount of an object, and setting the target value to a larger value as the reflection amount indicated by the reflection characteristic information is larger.

26. The method according to claim 4, further comprising setting the target value with a use of date and time information, map information, and direction information.

27. The method according to claim 4, further comprising setting the target value with a use of a past value.

28. The method according to claim 4, further comprising setting the target value with a use of an integration result of the adjusted number of responses generated in the past.

29. The method according to claim 4, further comprising setting the target value to a value obtained by subtracting a margin value that can be integrated in the memory from a predicted number of responses of the light reception array unit.

30. The method according to claim 2, further comprising obtaining a distance to an object that reflects light on a basis of an integration result of the adjusted number of responses generated.

31. The method according to claim 2, wherein the number of responses is a number of the light reception units simultaneously outputting the pulse signal.

* * * * *